United States Patent
Wei et al.

(10) Patent No.: US 10,620,915 B2
(45) Date of Patent: Apr. 14, 2020

(54) FULL ADDER CIRCUITS WITH REDUCED DELAY

(71) Applicant: MEDIATEK INC., Hsin-Chu (TW)

(72) Inventors: Ying-Chun Wei, Hsinchu (TW);
Min-Hang Hsieh, Hsinchu (TW);
Jen-Hang Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/111,277

(22) Filed: Aug. 24, 2018

(65) Prior Publication Data
US 2020/0065065 A1 Feb. 27, 2020

(51) Int. Cl.
*H03K 19/017* (2006.01)
*G06F 7/501* (2006.01)
*G06F 7/503* (2006.01)

(52) U.S. Cl.
CPC .............. *G06F 7/503* (2013.01); *G06F 7/501* (2013.01); *H03K 19/01721* (2013.01); *H03K 19/01742* (2013.01)

(58) Field of Classification Search
CPC ... G06F 7/501; G06F 7/503; H03K 19/01721; H03K 19/0174
USPC .................................................. 708/702, 703
See application file for complete search history.

(56) References Cited

U.S. PATENT DOCUMENTS 5,905,667 A * 5/1999 Lee ........................ G06F 7/5016
708/700
6,130,559 A * 10/2000 Balsara .................. B82Y 10/00
326/112
6,700,405 B1 3/2004 Hirairi
2012/0306536 A1 * 12/2012 Shukh .................. H03K 19/215
326/52

FOREIGN PATENT DOCUMENTS

CN    204652349 U    9/2015
TW    200734918 A    9/2007

OTHER PUBLICATIONS

Boukadida, Hassen, Gafsi, & Besbes, "A novel low-power A2 adder scheme based on reduced transistor count Full-Adder cells," International Journal of Electronics and Computer Science Engineering, vol. 3, pp. 366-375, 2004 (Year: 2004).*

(Continued)

*Primary Examiner* — Matthew D Sandifer
(74) *Attorney, Agent, or Firm* — McClure, Qualey & Rodack, LLP

(57) ABSTRACT

A full adder circuit includes a carry out generating circuit and a sum bit generating circuit. The carry out generating circuit is configured to generate a first output signal based on a first input signal, a second input signal and a third input signal. The sum bit generating circuit is configured to receive the first output signal and generate a second output signal based on the first input signal, the second input signal, the third input signal and the first output signal. The first output signal and the second output signal provide results of an arithmetic operation on the first input signal, the second input signal and the third input signal. The sum bit generating circuit includes a first pull-up network and a first pull-down network. There are at most two stacked transistors in at one or both of the first pull-up network and the first pull-down network.

17 Claims, 11 Drawing Sheets

(56) References Cited

OTHER PUBLICATIONS

M. Alioto, G. Di Cataldo, and G. Palumbo, "Mixed Full Adder topologies for high-performance low-power arithmetic circuits," Microelectronics Journal, vol. 38, Issue 1, pp. 130-139, Jan. 2007 (Year: 2007).*

* cited by examiner

| Input | | | Output | |
| --- | --- | --- | --- | --- |
| A | B | $C_i$ | Sum | $C_o$ |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

FIG. 1
(PRIOR ART)

FULL ADDER CIRCUITS WITH REDUCED DELAY

BACKGROUND OF THE INVENTION

Field of the Invention

The invention relates to a full adder, and more particularly to a full adder with a novel circuit structure to reduce calculation delay.

Description of the Related Art

A full adder is a fundamental logic circuit of many logic devices, such as microcontrollers, processors, field programmable gate arrays (FPGAs) and many others. In general, a full adder represents an electronic circuit that has three inputs and two outputs.

FIG. 1 shows the truth table for a full adder. For the input signals, A represents a first adder input, B represents a second adder input, and Ci represents a carry input, which may be the carry output of a full adder from a previous stage. For the output signals, Sum represents a calculation result, which is a 1-bit result (the Sum bit) and Co represents a carry output. As shown in FIG. 1, when the number of input signals having a value of logic '1' is an odd number, the output value of the Sum bit will be '1'. Otherwise, the output value of the Sum bit will be '0'. In addition, when the number of input signals having a value of logic '1' is more than 1, the value of the carry output Co will be '1'. Otherwise, the value of the carry output Co will be '0'.

Because the full adder circuit is widely used in a variety of logic devices, how to reduce calculation delay and thereby increase the speed of the full adder is a topic worthy to be developed.

BRIEF SUMMARY OF THE INVENTION

Full adder circuits are provided. An exemplary embodiment of a full adder circuit comprises a carry out generating circuit and a sum bit generating circuit. The carry out generating circuit is configured to generate a first output signal based on a first input signal, a second input signal and a third input signal. The sum bit generating circuit is configured to receive the first output signal from the carry out generating circuit and generate a second output signal based on the first input signal, the second input signal, the third input signal and the first output signal. The first output signal and the second output signal provide results of an arithmetic operation on the first input signal, the second input signal and the third input signal. The sum bit generating circuit comprises a first pull-up network and a first pull-down network. There are at most two stacked transistors in one or both of the first pull-up network and the first pull-down network.

An exemplary embodiment of a full adder circuit comprises a carry out generating circuit and a sum bit generating circuit. The carry out generating circuit is configured to generate a first output signal based on a first input signal, a second input signal and a third input signal. The sum bit generating circuit is configured to receive the first output signal from the carry out generating circuit and generate a second output signal based on the first input signal, the second input signal, the third input signal and the first output signal. The first output signal and the second output signal provide results of an arithmetic operation on the first input signal, the second input signal and the third input signal. The full adder circuit is a mirror type full adder, and the sum bit generating circuit comprises a first pull-up network and a first pull-down network. There are at most two stacked transistors in both the first pull-up network and the first pull-down network.

An exemplary embodiment of a full adder circuit comprises a carry out generating circuit and a sum bit generating circuit. The carry out generating circuit is configured to generate a first output signal based on a first input signal, a second input signal and a third input signal. The sum bit generating circuit is configured to receive the first output signal from the carry out generating circuit and generate a second output signal based on the first input signal, the second input signal, the third input signal and the first output signal. The first output signal and the second output signal provide results of an arithmetic operation on the first input signal, the second input signal and the third input signal. The full adder circuit is a mirror type full adder. The sum bit generating circuit comprises a first pull-up network and a first pull-down network and the carry out generating circuit comprises a second pull-up network and a second pull-down network. There is at most one transistor in both the second pull-up network and the second pull-down network.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 1 shows the truth table for a full adder;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
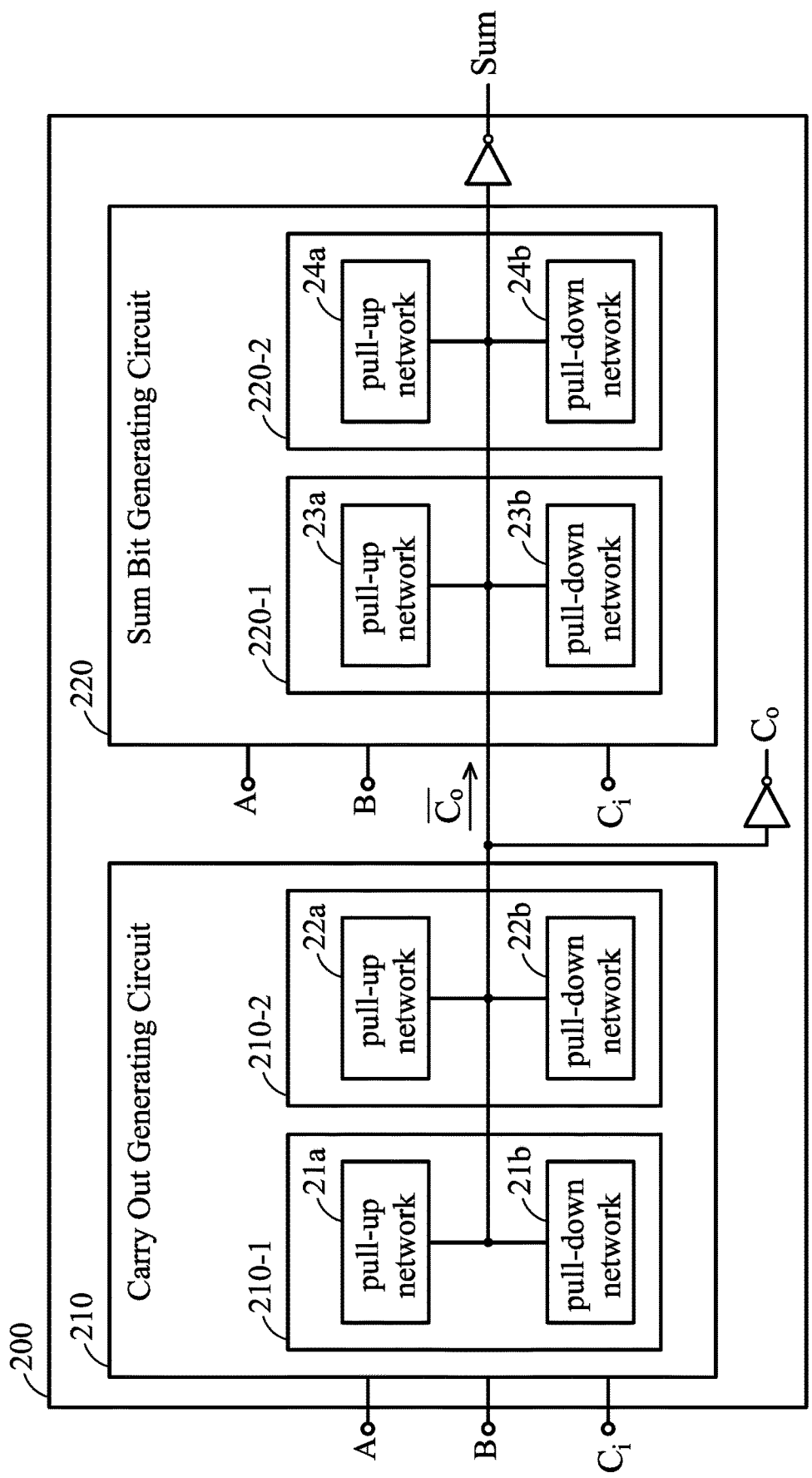
FIG. 2 is a block diagram of a full adder circuit according to an embodiment of the invention.

FIG. 2 is a block diagram of a full adder circuit according to an embodiment of the invention. The full adder circuit 200 may comprise a carry out generating circuit 210 and a sum bit generating circuit 220. The carry out generating circuit 210 is configured to generate a first output signal $\overline{Co}$ based on a first input signal A, a second input signal B and a third input signal Ci. Ci is the carry input, which may be a carry output of a full adder in a previous stage. $\overline{Co}$ is a complementary signal of the carry output Co of the full adder circuit 200.

The sum bit generating circuit 220 is coupled to the carry out generating circuit 210, configured to receive the first output signal $\overline{Co}$ from the carry out generating circuit 210 and generate a second output signal Sum based on the first input signal A, the second input signal B, the third input signal Ci and the first output signal $\overline{Co}$, where the second output signal Sum is the output Sum bit of the full adder circuit 200.

The carry output Co (or, its complementary signal $\overline{Co}$ as well) and the second output signal Sum provide the results of an arithmetic operation (that is, a full addition operation) on the first input signal A, the second input signal B and the third input signal Ci.

According to an embodiment of the invention, the full adder circuit 200 is a mirror type 1-bit full adder. To be more specific, according to an embodiment of the invention, the full adder circuit 200 is a mirror type 1-bit hybrid CMOS full adder, where the full adder circuit 200 comprises a plurality of pull-up networks and pull-down networks, and each pair of pull-up network and pull-down network are symmetric in structure.

The carry out generating circuit 210 may comprise circuit subunits 210-1 and 210-2. The circuit subunit 210-1 may comprise a pull-up network 21a and a pull-down network 21b. The pull-up network 21a is configured to perform an AND logic operation on the first input signal A and the second input signal B to obtain a first logic operation result, and perform an OR logic operation on the first logic operation result and the third input signal Ci to obtain a second logic operation result. The pull-up network 21a is further configured to perform an inverse operation on the second logic operation result.

The pull-down network 21b is configured to perform an OR logic operation on the first input signal A and the second input signal B to obtain a first logic operation result, and perform an AND logic operation on the first logic operation result and the third input signal Ci to obtain a second logic operation result. The pull-down network 21b is further configured to perform an inverse operation on the second logic operation result.

The circuit subunit 210-2 may comprise a pull-up network 22a and a pull-down network 22b. The circuit subunit 210-2 may be regarded as an output stage of the carry out generating circuit 210. The pull-up network 22a is configured to perform an OR logic operation on the first input signal A and the second input signal B to obtain a corresponding logic operation result. The pull-up network 22a is further configured to perform an inverse operation on the obtained logic operation result. The pull-down network 22b is configured to perform an AND logic operation on the first input signal A and the second input signal B to obtain a corresponding logic operation result. The pull-down network 22b is further configured to perform an inverse operation on the obtained logic operation result.

Via the logic operations performed by the pull-up networks and pull-down networks comprised in the carry out generating circuit 210, the first output signal $\overline{Co}$ and the corresponding carry output Co as well are generated by the carry out generating circuit 210. The first output signal $\overline{Co}$ is further provided to the sum bit generating circuit 220.

The sum bit generating circuit 220 may comprise circuit subunits 220-1 and 220-2. The circuit subunit 220-1 may comprise a pull-up network 23a and a pull-down network 23b. The pull-up network 23a is configured to perform an AND logic operation on the first input signal A, the second input signal B and third input signal Ci to obtain a first logic operation result, and perform an OR logic operation on the first logic operation result and the first output signal $\overline{Co}$ to obtain a second logic operation result. The pull-up network 23a is further configured to perform an inverse operation on the second logic operation result.

The pull-down network 23b is configured to perform an OR logic operation on the first input signal A, the second input signal B and third input signal Ci to obtain a first logic operation result, and perform an AND logic operation on the first logic operation result and the first output signal $\overline{Co}$ to obtain a second logic operation result. The pull-down network 23b is further configured to perform an inverse operation on the second logic operation result.

The circuit subunit 220-2 may comprise a pull-up network 24a and a pull-down network 24b. The circuit subunit 220-2 may be regarded as the output stage of the sum bit generating circuit 220. The pull-up network 24a is configured to perform an OR logic operation on the first input signal A, the second input signal B and third input signal Ci to obtain a corresponding logic operation result. The pull-up network 24a is further configured to perform an inverse operation on the obtained logic operation result. The pull-down network 24b is configured to perform an AND logic operation on the first input signal A, the second input signal B and third input signal Ci to obtain a corresponding logic operation result. The pull-down network 24b is further configured to perform an inverse operation on the obtained logic operation result.

Via the logic operations performed by the pull-up networks and pull-down networks comprised in the sum bit generating circuit 220, the second output signal Sum (and its corresponding complementary signal as well) is generated.

Figure 3:
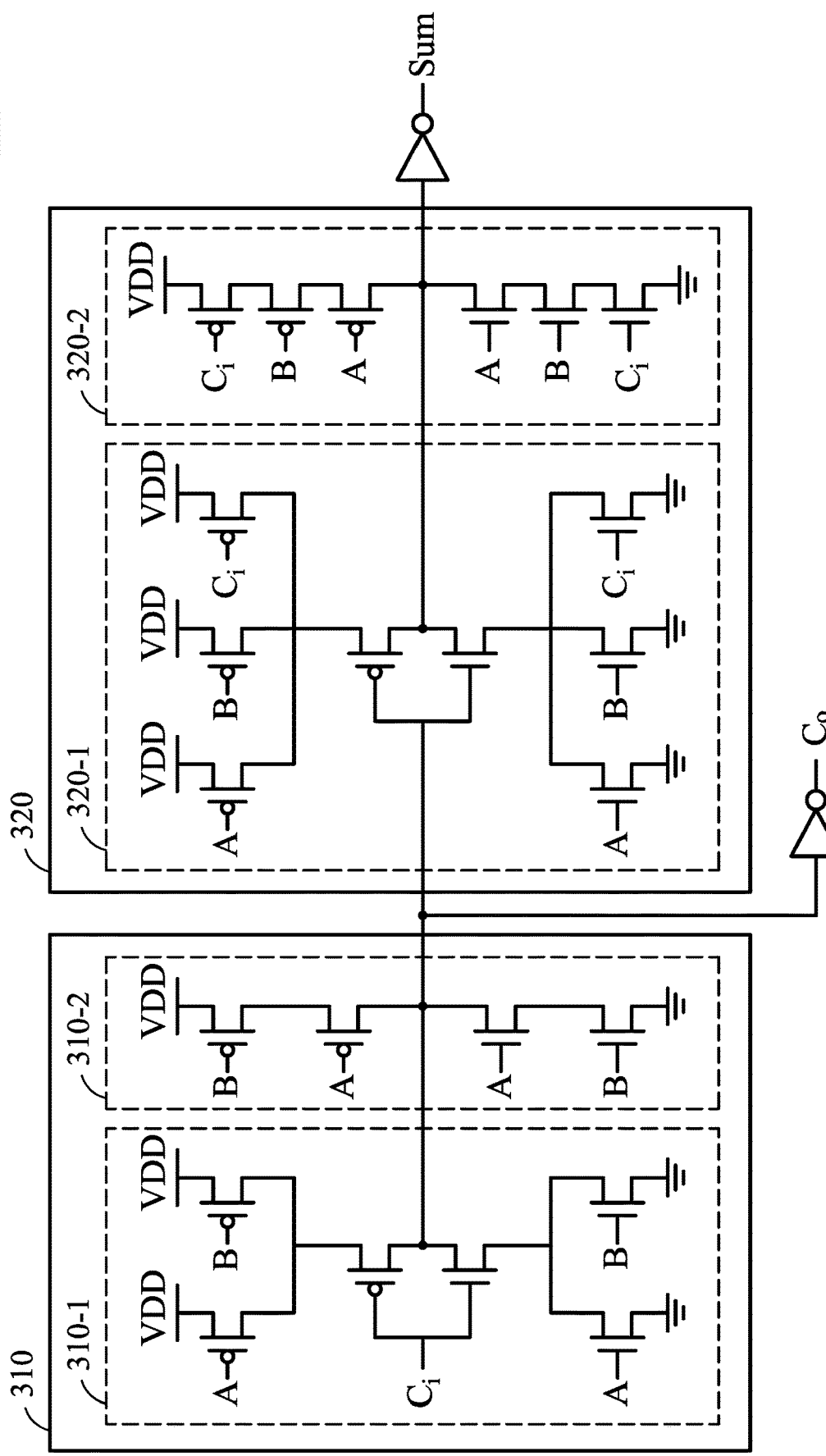
FIG. 3 is an exemplary circuit diagram of a full adder circuit according to a first embodiment of the invention.

FIG. 3 is an exemplary circuit diagram of a full adder circuit according to a first embodiment of the invention. The full adder circuit 300 may comprise a carry out generating circuit 310 and a sum bit generating circuit 320. The carry out generating circuit 310 is configured to generate the first output signal $\overline{Co}$ based on the first input signal A, the second input signal B and the third input signal Ci. Ci is the carry input, which may be a carry output of a full adder in a previous stage. $\overline{Co}$ is a complementary signal of the carry output Co of the full adder circuit 300.

The sum bit generating circuit 320 is coupled to the carry out generating circuit 310, configured to receive the first output signal $\overline{Co}$ from the carry out generating circuit 310 and generate a second output signal Sum based on the first input signal A, the second input signal B, the third input signal Ci and the first output signal $\overline{Co}$, where the second output signal Sum is the output Sum bit of the full adder circuit 300.

The carry out generating circuit 310 may comprise circuit subunits 310-1 and 310-2. The circuit subunit 310-1 may comprise a pull-up network and a pull-down network. The pull-up network of the circuit subunit 310-1 is composed of a plurality of PMOS transistors coupled between a positive voltage supply VDD and an output terminal of the carry out generating circuit 310, and is configured to perform the corresponding logic operations as the pull-up network 21a of the circuit subunit 210-1 as illustrated above. The pull-down network of the circuit subunit 310-1 is composed of a plurality of NMOS transistors coupled between a ground voltage supply and the output terminal of the carry out generating circuit 310, and is configured to perform the corresponding logic operations as the pull-down network 21b of the circuit subunit 210-1 as illustrated above.

The circuit subunit 310-2 may comprise a pull-up network and a pull-down network. The pull-up network of the circuit subunit 310-2 is composed of a plurality of PMOS transistors coupled between the positive voltage supply VDD and the output terminal of the carry out generating circuit 310, and is configured to perform the corresponding logic operations as the pull-up network 22a of the circuit subunit 210-2 as illustrated above. The pull-down network of the circuit subunit 310-2 is composed of a plurality of NMOS transistors coupled between the ground voltage supply and the output terminal of the carry out generating circuit 310, and is configured to perform the corresponding logic operations as the pull-down network 22b of the circuit subunit 210-2 as illustrated above.

The sum bit generating circuit 320 may comprise circuit subunits 320-1 and 320-2. The circuit subunit 320-1 may comprise a pull-up network and a pull-down network. The pull-up network of the circuit subunit 320-1 is composed of a plurality of PMOS transistors coupled between the positive voltage supply VDD and the output terminal of the sum bit generating circuit 320, and is configured to perform the corresponding logic operations as the pull-up network 23a of the circuit subunit 220-1 as illustrated above. The pull-down network of the circuit subunit 320-1 is composed of a plurality of NMOS transistors coupled between the ground voltage supply and the output terminal of the sum bit generating circuit 320, and is configured to perform the corresponding logic operations as the pull-down network 23b of the circuit subunit 220-1 as illustrated above.

The circuit subunit 320-2 may comprise a pull-up network and a pull-down. The pull-up network of the circuit subunit 320-2 is composed of a plurality of PMOS transistors coupled between the positive voltage supply VDD and the output terminal of the sum bit generating circuit 320, and is configured to perform the corresponding logic operations as the pull-up network 24a of the circuit subunit 220-2 as illustrated above. The pull-down network of the circuit subunit 320-2 is composed of a plurality of NMOS transistors coupled between the ground voltage supply and the output terminal of the sum bit generating circuit 320, and is configured to perform the corresponding logic operations as the pull-down network 24b of the circuit subunit 220-2 as illustrated above.

In the first embodiment of the invention, there are three stacked PMOS transistors configured in the pull-up network in the circuit subunit 320-2 and also three stacked NMOS transistors configured in the pull-down network in the circuit subunit 320-2. Each of the three stacked MOS transistors is configured to receive one of the first input signal A, the second input signal B and the third input signal Ci (that is, configured to receive the first input signal A, the second input signal B or the third input signal Ci).

Compared to the non-mirror type full adder, the mirror type full adder circuit 300 can output the carry out Co faster with only two logic gate delay and output the sum bit Sum faster with only three logic gate delay. In addition, it is also more robust in the low VDD voltage condition and is more area efficient.

Figure 4:
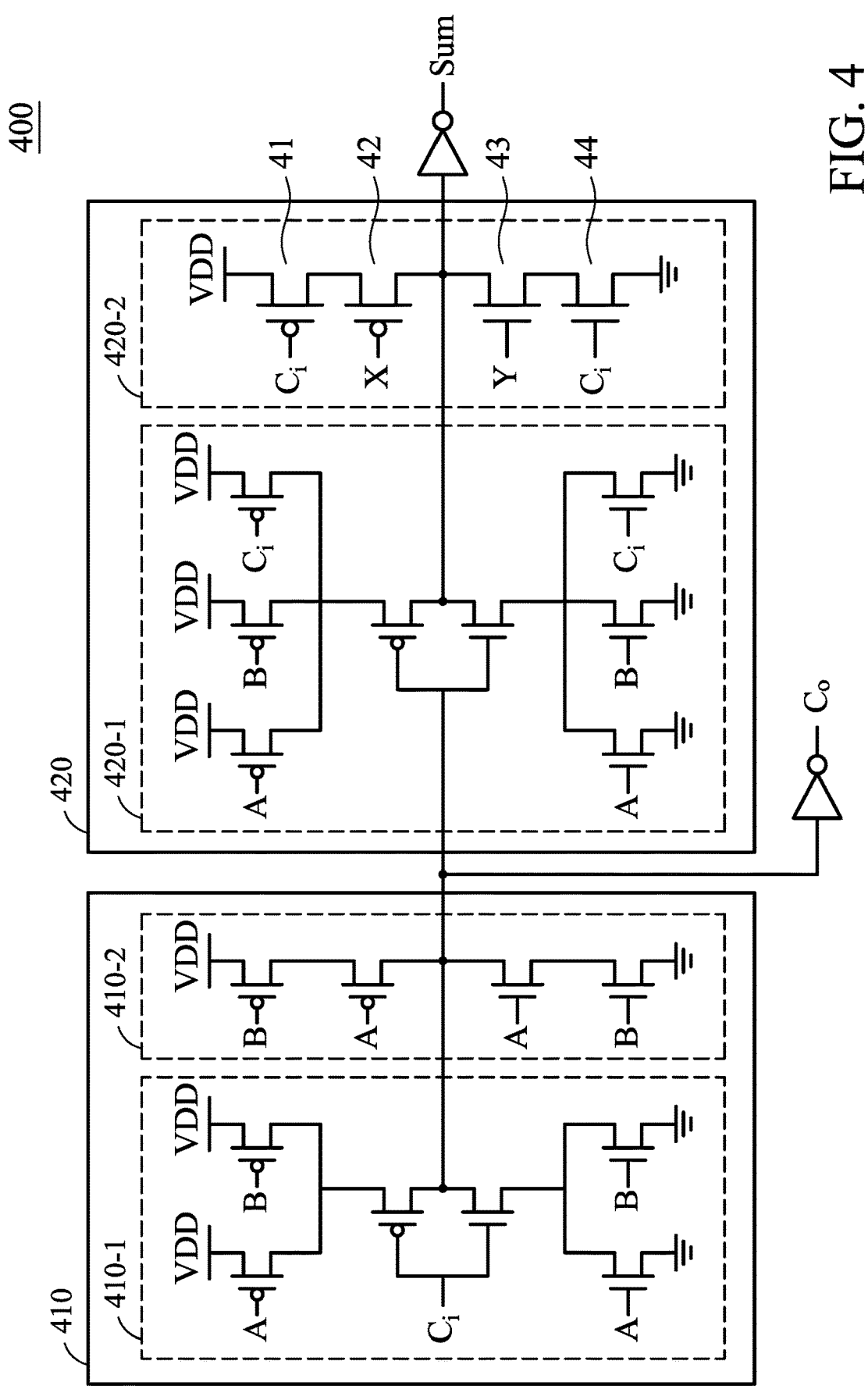
FIG. 4 is an exemplary circuit diagram of a full adder circuit according to a second embodiment of the invention.

FIG. 4 is an exemplary circuit diagram of a full adder circuit according to a second embodiment of the invention. The full adder circuit 400 may comprise a carry out generating circuit 410 and a sum bit generating circuit 420. The carry out generating circuit 410 is configured to generate the first output signal $\overline{Co}$ based on the first input signal A, the second input signal B and the third input signal Ci. Ci is the carry input, which may be a carry output of a full adder in a previous stage. $\overline{Co}$ is a complementary signal of the carry output Co of the full adder circuit 400.

The sum bit generating circuit 420 is coupled to the carry out generating circuit 410, configured to receive the first output signal $\overline{Co}$ from the carry out generating circuit 410 and generate a second output signal Sum based on the first input signal A, the second input signal B, the third input signal Ci and the first output signal $\overline{Co}$, where the second output signal Sum is the output Sum bit of the full adder circuit 400.

The carry out generating circuit 410 may comprise circuit subunits 410-1 and 410-2. The circuit subunit 410-1 may comprise a pull-up network and a pull-down network. The pull-up network of the circuit subunit 410-1 is composed of a plurality of PMOS transistors coupled between the positive voltage supply VDD and an output terminal of the carry out generating circuit 410, and is configured to perform the corresponding logic operations as the pull-up network 21a of the circuit subunit 210-1 as illustrated above. The pull-down network of the circuit subunit 410-1 is composed of a plurality of NMOS transistors coupled between the ground voltage supply and the output terminal of the carry out generating circuit 410, and is configured to perform the corresponding logic operations as the pull-down network 21b of the circuit subunit 210-1 as illustrated above.

The circuit subunit 410-2 may comprise a pull-up network and a pull-down. The pull-up network of the circuit subunit 410-2 is composed of a plurality of PMOS transistors coupled between the positive voltage supply VDD and the output terminal of the carry out generating circuit 410, and is configured to perform the corresponding logic operations as the pull-up network 22a of the circuit subunit 210-2 as illustrated above. The pull-down network of the circuit subunit 410-2 is composed of a plurality of NMOS transistors coupled between the ground voltage supply and the output terminal of the carry out generating circuit 410, and is configured to perform the corresponding logic operations as the pull-down network 22b of the circuit subunit 210-2 as illustrated above.

The sum bit generating circuit 420 may comprise circuit subunits 420-1 and 420-2. The circuit subunit 420-1 may comprise a pull-up network and a pull-down network. The pull-up network of the circuit subunit 420-1 is composed of a plurality of PMOS transistors coupled between the positive voltage supply VDD and the output terminal of the sum bit generating circuit 420, and is configured to perform the corresponding logic operations as the pull-up network 23a of the circuit subunit 220-1 as illustrated above. The pull-down network of the circuit subunit 420-1 is composed of a plurality of NMOS transistors coupled between the ground voltage supply and the output terminal of the sum bit generating circuit 420, and is configured to perform the corresponding logic operations as the pull-down network 23b of the circuit subunit 220-1 as illustrated above.

The circuit subunit 420-2 may comprise a pull-up network and a pull-down network. The circuit subunit 420-2 may comprise a pull-up network and a pull-down network. The pull-up network of the circuit subunit 420-2 is composed of a plurality of PMOS transistors coupled between the positive voltage supply VDD and the output terminal of the sum bit generating circuit 420, and is configured to perform the corresponding logic operations as the pull-up network 24a of the circuit subunit 220-2 as illustrated above. The pull-down network of the circuit subunit 420-2 is composed of a plurality of NMOS transistors coupled between the ground voltage supply and the output terminal of the sum bit generating circuit 420, and is configured to perform the corresponding logic operations as the pull-down network 24b of the circuit subunit 220-2 as illustrated above.

In the second embodiment of the invention, there are at most two stacked transistors (or, only two stacked transistors) in at one or both of the pull-up network and the pull-down network in the circuit subunit 420-2. As an example, as shown in FIG. 4, there are at most two stacked PMOS transistors configured in the pull-up network in the circuit subunit 420-2 and also at most two stacked NMOS transistors configured in the pull-down network in the circuit subunit 420-2.

Compared to the first embodiment, in the second embodiment of the invention, the number of stacked MOSFETs in the circuit subunit 420-2 has been reduced, which can further reduce the cell delay of the full adder circuit 400, especially in the low VDD voltage condition. It should be noted that in the embodiment of the invention, the low VDD voltage may refer to ½ nominal voltage defined by a specific process. As an example, if the nominal voltage of the voltage supply VDD in an 18 nm process is 1V, the low VDD voltage may refer to cases where the supply voltage is not greater than 0.5V.

According to an embodiment of the invention, the pull-up network in the circuit subunit 420-2 comprises two PMOS transistors coupled in serial between the voltage supply VDD and the output terminal of the sum bit generating circuit 420. The gate of one of the two PMOS transistors is configured to receive one of first input signal A, the second input signal B and the third input signal C1, and the gate of the other of the two PMOS transistors is configured to receive a first intermediate control signal X, which is the result of a logic operation on the remaining two of the first input signal A, the second input signal B and the third input signal Ci.

As an example, the gate of the PMOS transistor 41 is configured to receive the third input signal Ci, and the gate of the PMOS transistor 42 is configured to receive the first intermediate control signal X.

Similarly, the pull-down network in the circuit subunit 420-2 comprises two NMOS transistors coupled in serial between the ground voltage supply and the output terminal of the sum bit generating circuit 420. The gate of one of the two NMOS transistors is configured to receive one of first input signal A, the second input signal B and the third input signal C1, and the gate of the other of the two NMOS transistors is configured to receive a second intermediate control signal Y, which is the result of a logic operation on the remaining two of the first input signal A, the second input signal B and the third input signal Ci.

As an example, the gate of the NMOS transistor 43 is configured to receive the second intermediate control signal Y, and the gate of the NMOS transistor 44 is configured to receive the third input signal Ci.

Figure 5B:
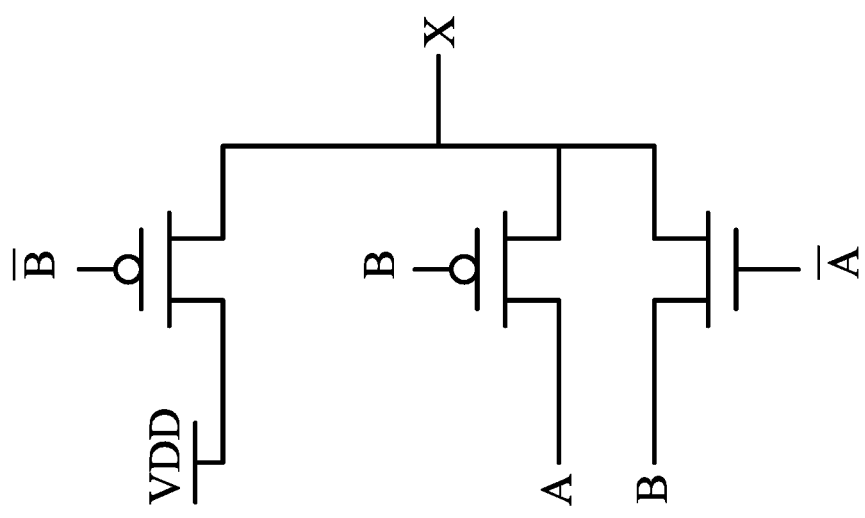
FIG. 5B is an exemplary circuit diagram of a control circuit generating the second intermediate control signal Y according to an embodiment of the invention.
Figure 5A:
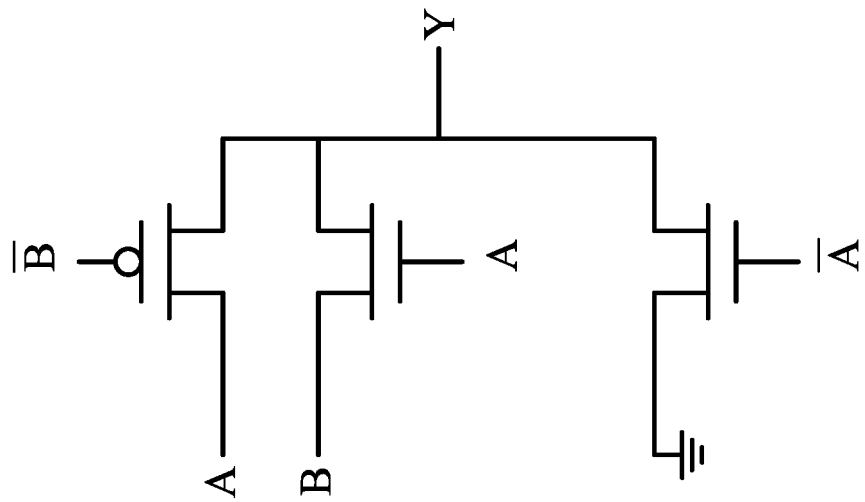
FIG. 5A is an exemplary circuit diagram of a control circuit generating the first intermediate control signal X according to an embodiment of the invention.

FIG. 5A is an exemplary circuit diagram of a control circuit generating the first intermediate control signal X according to an embodiment of the invention. The control circuit 50A is configured to implement an logic OR operation on the first input signal A and the second input signal B to generate the first intermediate control signal X, where $\overline{A}$ is a complementary signal of the first input signal A, $\overline{B}$ is a complementary signal of the second input signal B, and X=(A OR B).

FIG. 5B is an exemplary circuit diagram of a control circuit generating the second intermediate control signal Y according to an embodiment of the invention. The control circuit 50B is configured to implement an logic AND operation on the first input signal A and the second input signal B to generate the second intermediate control signal Y, where Y=(A AND B).

Figure 5D:
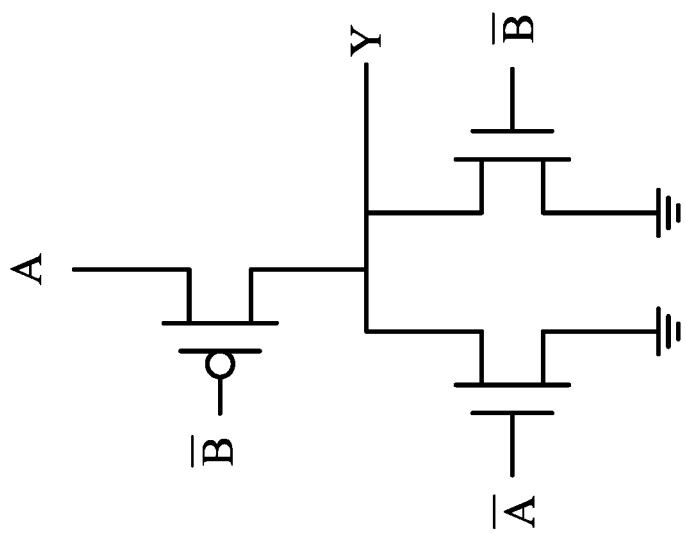
FIG. 5D is another exemplary circuit diagram of a control circuit generating the second intermediate control signal Y according to an embodiment of the invention.
Figure 5C:
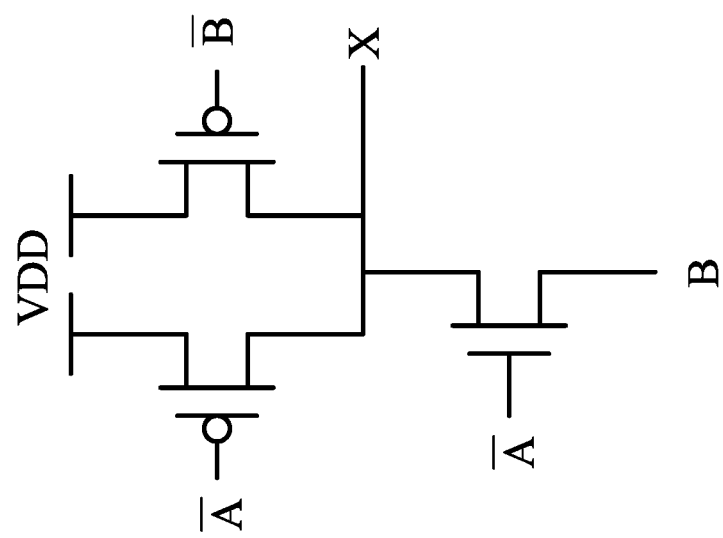
FIG. 5C is another exemplary circuit diagram of a control circuit generating the first intermediate control signal X according to an embodiment of the invention.

FIG. 5C is another exemplary circuit diagram of a control circuit generating the first intermediate control signal X according to an embodiment of the invention. The control circuit 50C is configured to implement a logic OR operation on the first input signal A and the second input signal B to generate the first intermediate control signal X, where X=(A OR B).

FIG. 5D is another exemplary circuit diagram of a control circuit generating the second intermediate control signal Y according to an embodiment of the invention. The control circuit 50D is configured to implement a logic AND operation on the first input signal A and the second input signal B to generate the second intermediate control signal Y, where Y=(A AND B).

It should be noted that the OR/AND logic can by implemented by a variety of CMOS logic families, such as the Pass-transistor logic (PTL), complementary pass-transistor logic (CPL), double pass-transistor logic (DPL), dual value logic (DVL), etc. Therefore, FIG. 5A, FIG. 5B, FIG. 5C and FIG. 5D only show some of the many circuit structures to carry out the OR/AND function for generating the intermediate control signals X and Y, and the invention should not be limited thereto.

Figure 6:
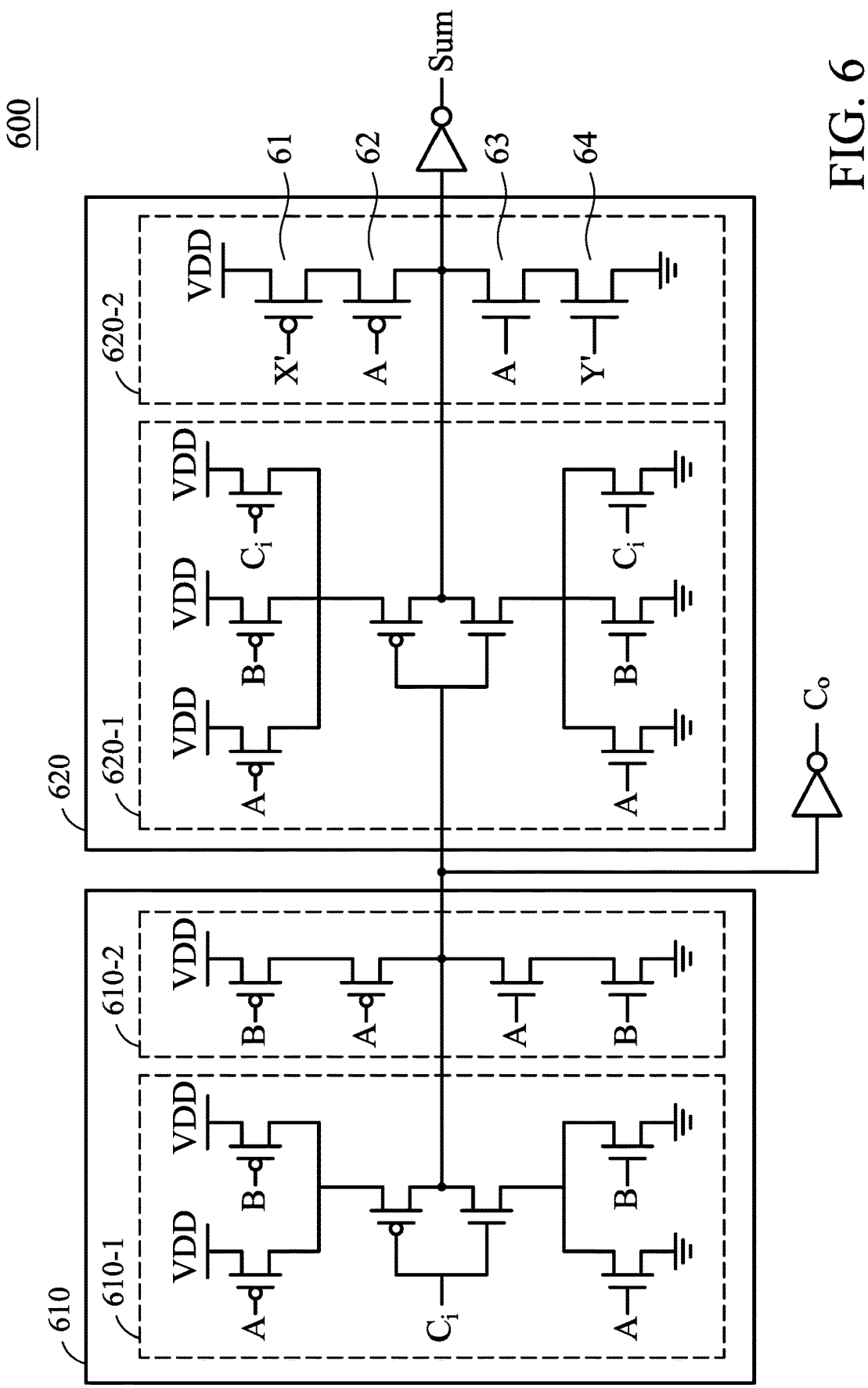
FIG. 6 is another exemplary circuit diagram of a full adder circuit according to a second embodiment of the invention.

FIG. 6 is another exemplary circuit diagram of a full adder circuit according to a second embodiment of the invention. The full adder circuit 600 may comprise a carry out generating circuit 610 and a sum bit generating circuit 620. The carry out generating circuit 610 may comprise circuit subunits 610-1 and 610-2. The sum bit generating circuit 620 may comprise circuit subunits 620-1 and 620-2. The circuit structure of the full adder circuit 600 is similar to that of the full adder circuit 400. For the same components, reference may be made to the corresponding descriptions for the full adder circuit 400, and are omitted for brevity.

In this embodiment, the gate of the PMOS transistor 61 is configured to receive the first intermediate control signal X', and the gate of the PMOS transistor 62 is configured to receive the first input signal A. In addition, the gate of the NMOS transistor 63 is configured to receive the first input signal A, and the gate of the NMOS transistor 64 is configured to receive the second intermediate control signal Y'

Figure 7B:
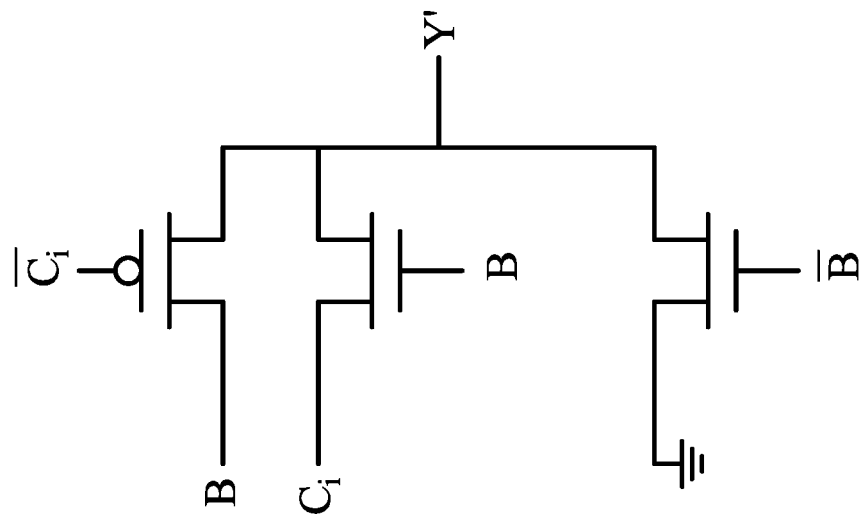
FIG. 7B is an exemplary circuit diagram of a control circuit generating the second intermediate control signal Y' according to an embodiment of the invention.
Figure 7A:
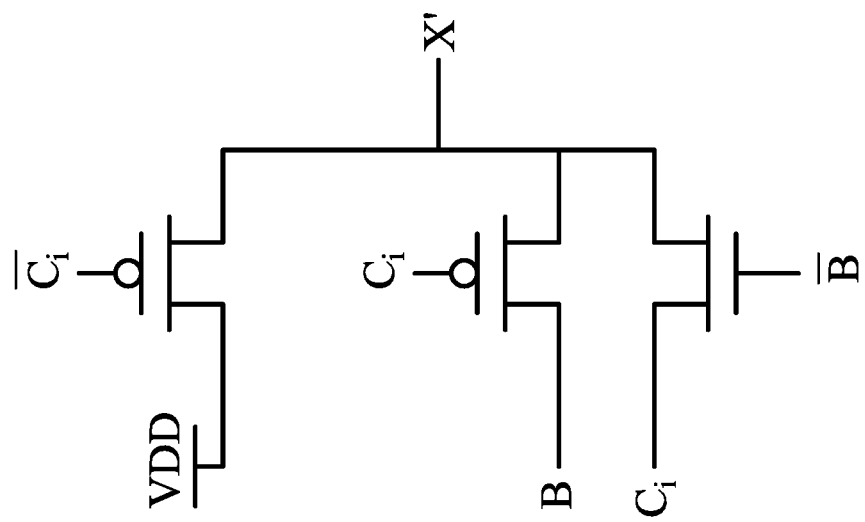
FIG. 7A is an exemplary circuit diagram of a control circuit generating the first intermediate control signal X' according to an embodiment of the invention.

FIG. 7A is an exemplary circuit diagram of a control circuit generating the first intermediate control signal X' according to an embodiment of the invention. The control circuit 70A is configured to implement a logic OR operation on the second input signal B and the third input signal Ci to generate the first intermediate control signal X', where X'=(B OR Ci).

FIG. 7B is an exemplary circuit diagram of a control circuit generating the second intermediate control signal Y' according to an embodiment of the invention. The control circuit 70B is configured to implement a logic AND operation on the second input signal B and the third input signal Ci to generate the second intermediate control signal Y', where Y'=(B AND Ci).

It should be noted that the OR/AND logic can by implemented by a variety of CMOS logic families, such as the Pass-transistor logic (PTL), complementary pass-transistor logic (CPL), double pass-transistor logic (DPL), dual value logic (DVL), etc. Therefore, FIG. 7A and FIG. 7B only show two of the many circuit structures to carry out the OR/AND function for generating the intermediate control signals X' and Y', and the invention should not be limited thereto.

Figure 8:
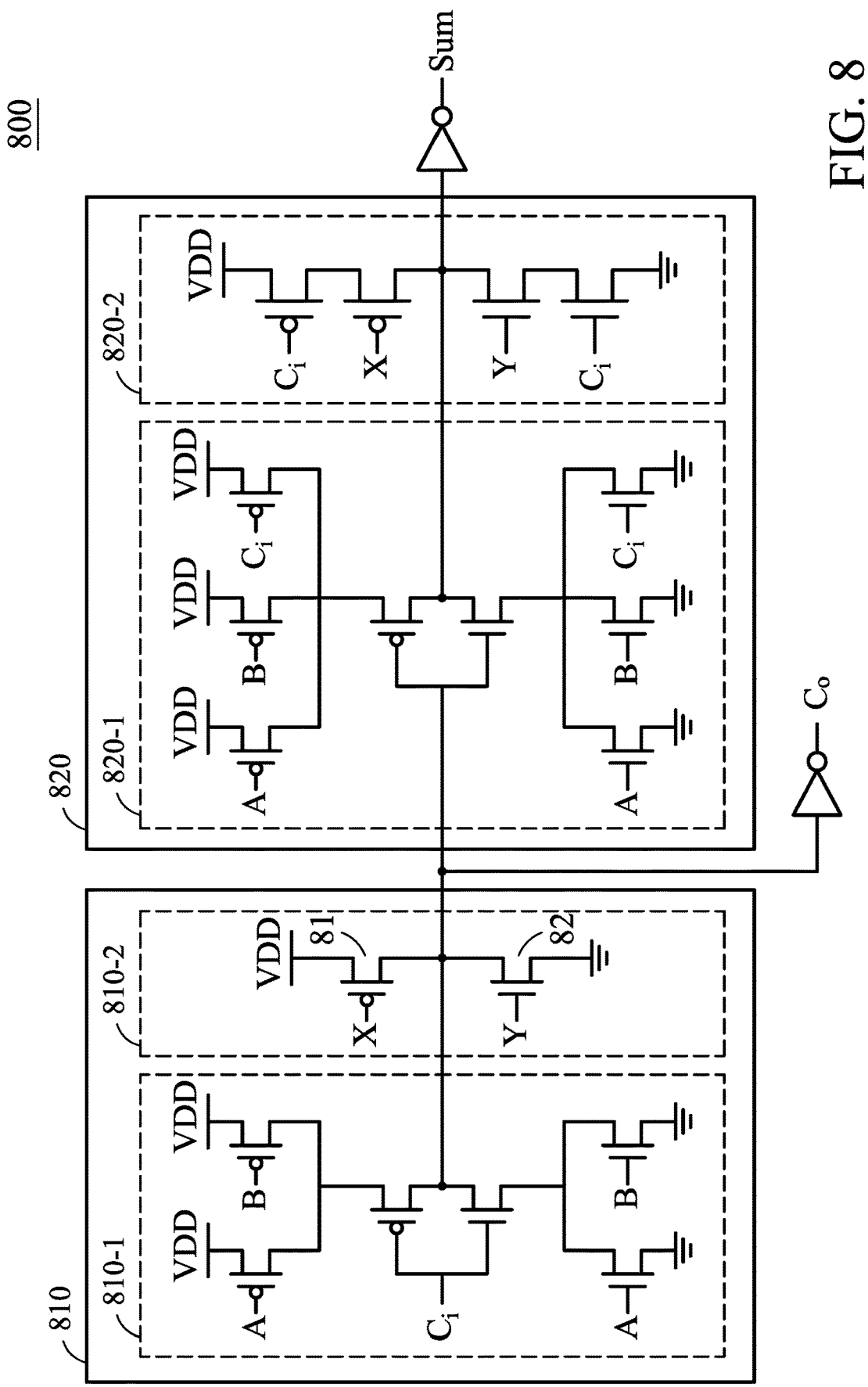
FIG. 8 is an exemplary circuit diagram of a full adder circuit according to a third embodiment of the invention.

FIG. 8 is an exemplary circuit diagram of a full adder circuit according to a third embodiment of the invention. The full adder circuit 800 may comprise a carry out generating circuit 810 and a sum bit generating circuit 820. The carry out generating circuit 810 may comprise circuit subunits 810-1 and 810-2. The sum bit generating circuit 820 may comprise circuit subunits 820-1 and 820-2. The circuit structure of the full adder circuit 800 is similar to that of the full adder circuit 400. For the same components, reference may be made to the corresponding description for the full adder circuit 400, and are omitted for brevity.

In the third embodiment of the invention, there is at most one transistor (or, only one transistor) in at one or both of the pull-up network and the pull-down network in the circuit subunit 810-2. As an example, as shown in FIG. 8, there is only one PMOS transistor configured in the pull-up network of the circuit subunit 810-2 and also only one NMOS transistor configured in the pull-down network of the circuit subunit 810-2. In other words, in the third embodiment of the invention, there may be no stacked transistor in both the pull-up network and the pull-down network of the circuit subunit 810-2.

It should be noted that in other embodiments of the invention, the structure of the circuit subunit 820-2 may also be implemented by the ways as the circuit subunit 320-2 shown in FIG. 3, the circuit subunit 620-2 shown in FIG. 6, or any other alternate or modified structure discussed above. Therefore, the invention should not be limited to the structure shown in FIG. 8.

In the embodiment shown in FIG. 8, the PMOS transistor 81 is coupled between the voltage supply VDD and the output terminal of the carry out generating circuit 810 and the gate of the PMOS transistor 81 is configured to receive the first intermediate control signal X, which is the result of a logic operation on the first input signal X and the second input signal Y. In this embodiment, X=(A OR B). In addition, the NMOS transistor 82 is coupled between the ground supply and the output terminal of the carry out generating circuit 810 and the gate of the NMOS transistor 82 is configured to receive the second intermediate control signal Y, which is the result of a logic operation on the first input signal X and the second input signal Y. In this embodiment, Y=(A AND B).

The control circuits for generating the first intermediate control signal X and the second intermediate control signal Y may be referred to FIGS. 5A-5D, and are omitted for brevity. Note that as discussed above, the invention should not be limited to only the structures shown in FIGS. 5A-5D.

Figure 9A:
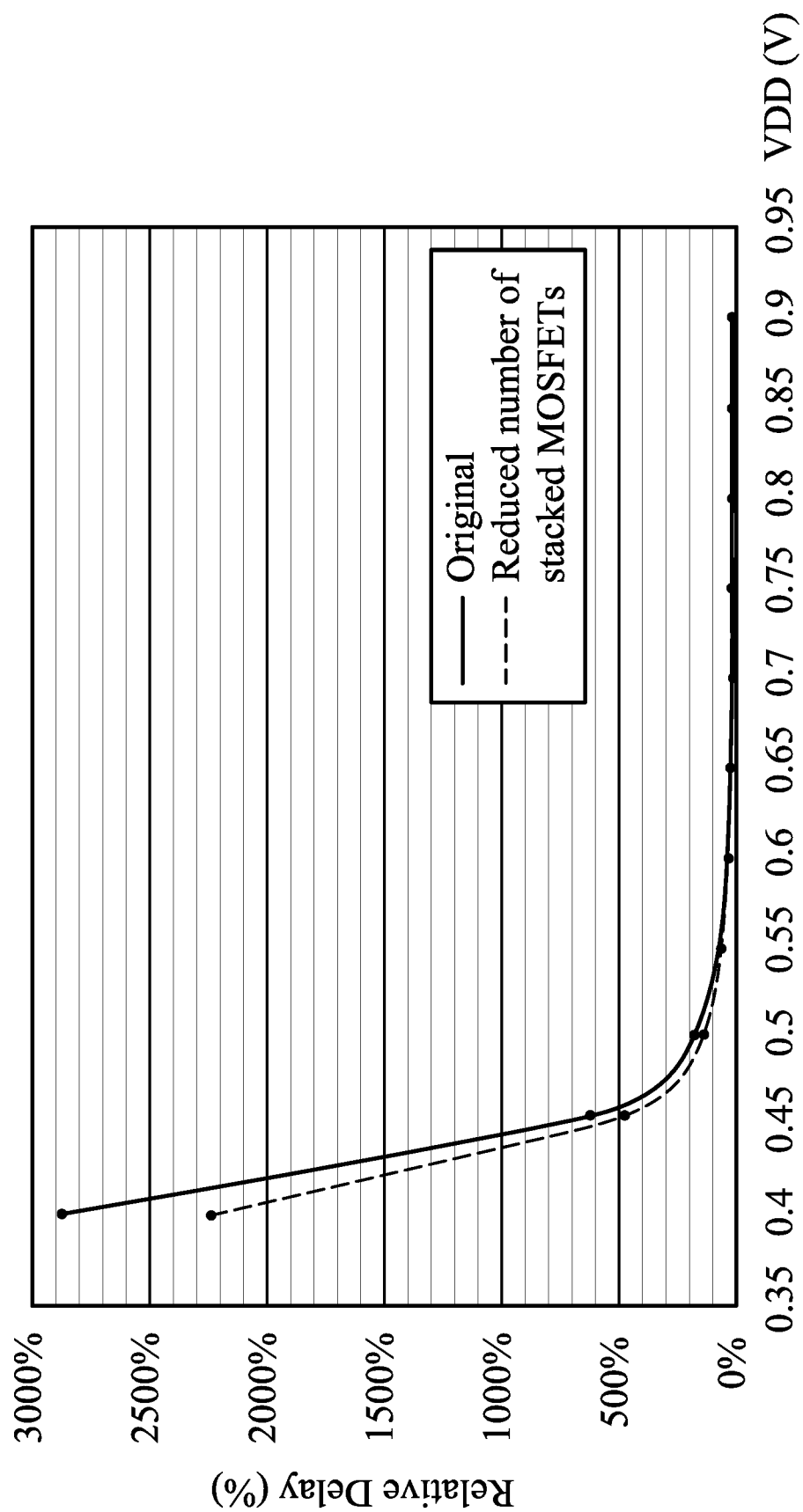
FIG. 9A is an exemplary diagrams showing the relative delays of the full adder circuit without reduced number of stacked MOSFETs versus the relative delay of the full adder circuit with reduced number of stacked MOSFETs.
Figure 9B:
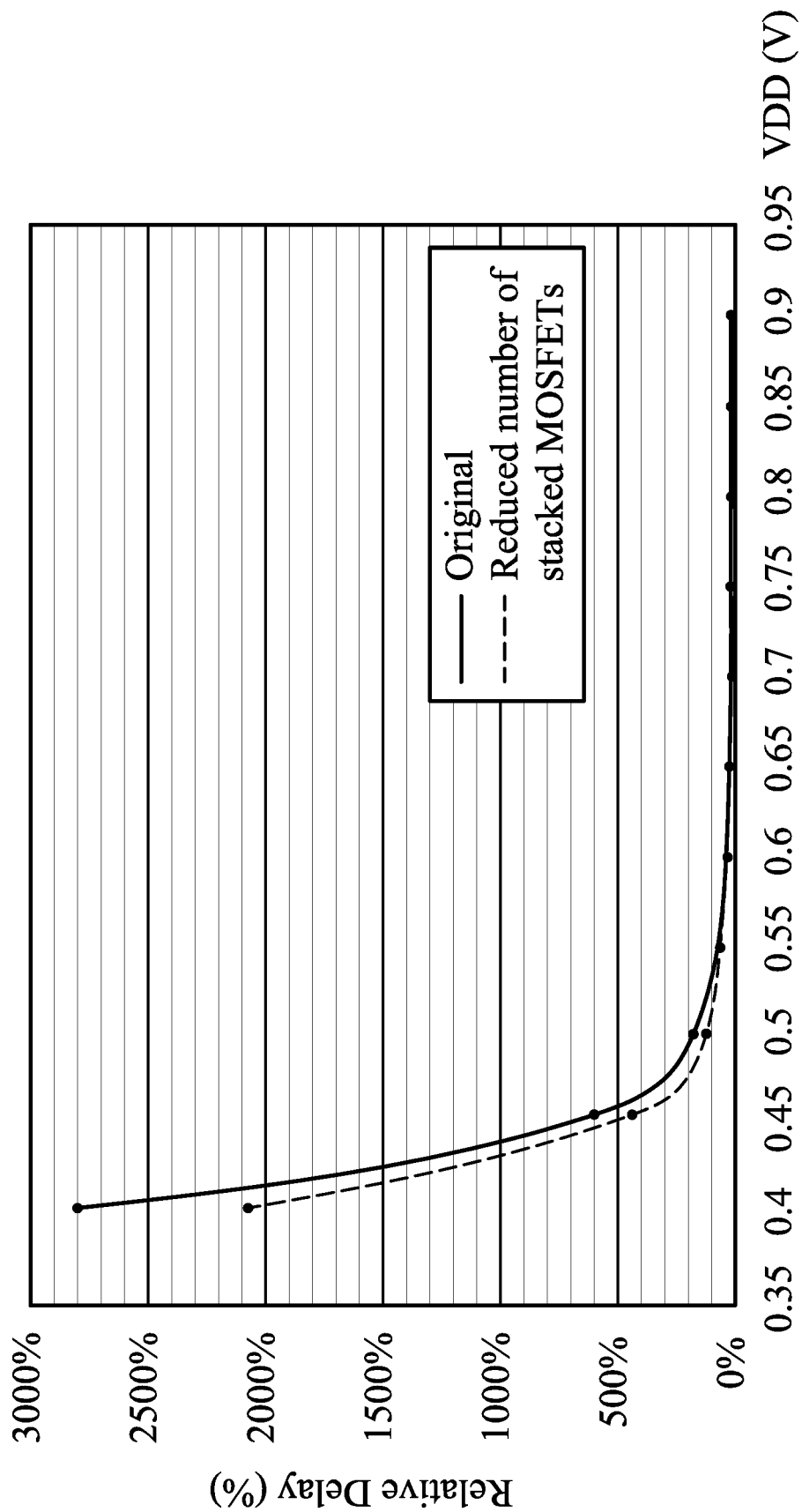
FIG. 9B is another exemplary diagrams showing the relative delays of the full adder circuit without reduced number of stacked MOSFETs versus the relative delay of the full adder circuit with reduced number of stacked MOSFETs.

FIG. 9A and FIG. 9B are the exemplary diagrams showing the relative delays of the full adder circuit without reduced number of stacked MOSFETs (that is, the original structure, such as the full adder circuit in the first embodiment of the invention) versus the relative delay of the full adder circuit with reduced number of stacked MOSFETs (for example, the full adder circuit in the second embodiment of the invention). The relative delays are the delays measured under different values of voltage supply VDD with respect to the delay measured under a specific value VDD=0.8V. Using the relative delay diagram, it is easy to show the amount of change in the delay when the supply voltage VDD is decreasing.

The delays shown in FIG. 9A are the delays of the third input signal Ci to the second output signal Sum, and the delays shown in FIG. 9B are the delays of the first input signal A to the carry output signal Co. Here, the term "delay" refers to the timing difference between the transient of the input signal and the output signal. The transient time of a signal may be measured at a specific signal value, such as 0.5VDD. For example, the delay shown in FIG. 9A may be obtained by measuring the difference between the time when the voltage of the third input signal Ci (raised from 0/dropped from VDD and) reaches 0.5VDD and the time when the voltage of the second output signal Sum (raised from 0/dropped from VDD and) reaches 0.5VDD, accordingly.

As shown in FIG. 9A, compared to the original structure, when the number of stacked MOSFETs is reduced (for example, from 3 to 2 in both the pull-up network and the pull-down network of the output stage of the full adder), the relative delay is also reduced. Similarly, as shown in FIG. 9B, compared to the original structure, when the number of stacked MOSFETs is reduced (for example, from 3 to 2 in both the pull-up network and the pull-down network of the output stage of the full adder), the relative delay is also reduced.

Compared to the first embodiment, in the second embodiment of the invention, the number of stacked MOSFETs in the circuit subunit 420-2/620-2 has been reduced, which can greatly reduce the cell delay of the full adder circuit, especially in the low VDD voltage condition. In addition, in the third embodiment of the invention, the number of MOSFETs in the circuit subunit 820-2 has also been reduced, which can further reduce the cell delay of the full adder circuit.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:
1. A full adder circuit, comprising:
a carry out generating circuit, configured to receive a first input signal, a second input signal and a third input signal and generate a first output signal based on the first input signal, the second input signal and the third input signal; and
a sum bit generating circuit, coupled to the carry out generating circuit, configured to receive the first output signal from the carry out generating circuit, the first input signal, the second input signal and the third input signal and generate a second output signal based on the first input signal, the second input signal, the third input signal and the first output signal, wherein the first output signal and the second output signal provide results of an arithmetic operation on the first input signal, the second input signal and the third input signal, wherein the sum bit generating circuit comprises a first pull-up network and a first pull-down network, wherein the first pull-up network comprises two PMOS transistors coupled in serial between a positive voltage supply and an output terminal, wherein a gate of one of the two PMOS transistors is configured to receive one of the first input signal, the second input signal and the third input signal, and a gate of the other of the two PMOS transistors is configured to receive a first intermediate control signal, which is a result of a logic operation on the remaining two of the first input signal, the second input signal and the third input signal, and wherein there are at most two stacked transistors in one or both of the first pull-up network and the first pull-down network.

2. The full adder circuit as claimed in claim 1, wherein the first pull-up network and the first pull-down network are symmetric in structure.

3. The full adder circuit as claimed in claim 1, the full adder circuit is a mirror type full adder.

4. The full adder circuit as claimed in claim 1, wherein the first pull-down network comprises two NMOS transistors coupled in serial between a ground voltage supply and an output terminal.

5. The full adder circuit as claimed in claim 4, wherein a gate of one of the two NMOS transistors is configured to receive one of the first input signal, the second input signal and the third input signal, and a gate of the other of the two NMOS transistors is configured to receive a second intermediate control signal, which is a result of a logic operation on the remaining two of the first input signal, the second input signal and the third input signal.

6. The full adder circuit as claimed in claim 1, wherein the carry out generating circuit comprises a second pull-up network and a second pull-down network, and wherein there is at most one transistor in one or both of the second pull-up network and the second pull-down network.

7. A full adder circuit, comprising:
a carry out generating circuit, configured to receive a first input signal, a second input signal and a third input signal and generate a first output signal based on the first input signal, the second input signal and the third input signal; and
a sum bit generating circuit, coupled to the carry out generating circuit, configured to receive the first output signal from the carry out generating circuit, the first input signal, the second input signal and the third input signal and generate a second output signal based on the first input signal, the second input signal, the third input signal and the first output signal,
wherein the first output signal and the second output signal provide results of an arithmetic operation on the first input signal, the second input signal and the third input signal,
wherein the full adder circuit is a mirror type full adder, and the sum bit generating circuit comprises a first pull-up network and a first pull-down network, wherein the first pull-down network comprises two NMOS transistors coupled in serial between a ground voltage supply and an output terminal, wherein a gate of one of the two NMOS transistors is configured to receive one of the first input signal, the second input signal and the third input signal, and a gate of the other of the two NMOS transistors is configured to receive a second intermediate control signal, which is a result of a logic operation on the remaining two of the first input signal, the second input signal and the third input signal, and wherein there are at most two stacked transistors in both the first pull-up network and the first pull-down network.

8. The full adder circuit as claimed in claim 7, wherein the first pull-up network comprises two PMOS transistors coupled in serial between a positive voltage supply and an output terminal.

9. The full adder circuit as claimed in claim 8, wherein a gate of one of the two PMOS transistors is configured to receive one of the first input signal, the second input signal and the third input signal, and a gate of the other of the two PMOS transistors is configured to receive a first intermediate control signal, which is a result of a logic operation on the remaining two of the first input signal, the second input signal and the third input signal.

10. The full adder circuit as claimed in claim 7, wherein the carry out generating circuit comprises a second pull-up network and a second pull-down network, and wherein there is at most one transistor in both the second pull-up network and the second pull-down network.

11. A full add circuit, comprising:
a carry out generating circuit, configured to receive a first input signal, a second input signal and a third input signal and generate a first output signal based on the first input signal, the second input signal and the third input signal; and
a sum bit generating circuit, coupled to the carry out generating circuit, configured to receive the first output signal from the carry out generating circuit, the first input signal, the second input signal and the third input signal and generate a second output signal based on the first input signal, the second input signal, the third input signal and the first output signal,
wherein the first output signal and the second output signal provide results of an arithmetic operation on the first input signal, the second input signal and the third input signal,
wherein the full adder circuit is a mirror type full adder, the sum bit generating circuit comprises a first pull-up network and a first pull-down network, and the carry out generating circuit comprises a second pull-up network and a second pull-down network, wherein the second pull-up network comprises a PMOS transistor coupled between a positive voltage supply and an output terminal, wherein a gate of the PMOS transistor is configured to receive a first intermediate control signal, which is a result of a logic operation on the first input signal and the second input signal, and
wherein there is at most one transistor in both the second pull-up network and the second pull-down network.

12. The full adder circuit as claimed in claim 11, wherein there are at most two stacked transistors in both of the first pull-up network and the first pull-down network.

13. The full adder circuit as claimed in claim 11, wherein the second pull-down network comprises a NMOS transistor coupled between a ground voltage supply and an output terminal.

14. The full adder circuit as claimed in claim 13, wherein a gate of the NMOS transistor is configured to receive a second intermediate control signal, which is a result of a logic operation on the first input signal and the second input signal.

15. A full adder circuit, comprising:
   a carry out generating circuit, configured to receive a first input signal, a second input signal and a third input signal and generate a first output signal based on the first input signal, the second input signal and the third input signal; and
   a sum bit generating circuit, coupled to the carry out generating circuit, configured to receive the first output signal from the carry out generating circuit, the first input signal, the second input signal and the third input signal and generate a second output signal based on the first input signal, the second input signal, the third input signal and the first output signal,
   wherein the first output signal and the second output signal provide results of an arithmetic operation on the first input signal, the second input signal and the third input signal,
   wherein the sum bit generating circuit comprises a first pull-up network and a first pull-down network, wherein the first pull-down network comprises two NMOS transistors coupled in serial between a ground voltage supply and an output terminal, wherein a gate of one of the two NMOS transistors is configured to receive one of the first input signal, the second input signal and the third input signal, and a gate of the other of the two NMOS transistors is configured to receive a second intermediate control signal, which is a result of a logic operation on the remaining two of the first input signal, the second input signal and the third input signal, and
   wherein there are at most two stacked transistors in one or both of the first pull-up network and the first pull-down network.

16. A full adder circuit, comprising:
   a carry out generating circuit, configured to receive a first input signal, a second input signal and a third input signal and generate a first output signal based on the first input signal, the second input signal and the third input signal; and
   a sum bit generating circuit, coupled to the carry out generating circuit, configured to receive the first output signal from the carry out generating circuit, the first input signal, the second input signal and the third input signal and generate a second output signal based on the first input signal, the second input signal, the third input signal and the first output signal,
   wherein the first output signal and the second output signal provide results of an arithmetic operation on the first input signal, the second input signal and the third input signal,
   wherein the full adder circuit is a mirror type full adder, and the sum bit generating circuit comprises a first pull-up network and a first pull-down network, wherein the first pull-up network comprises two PMOS transistors coupled in serial between a positive voltage supply and an output terminal, wherein a gate of one of the two PMOS transistors is configured to receive one of the first input signal, the second input signal and the third input signal, and a gate of the other of the two PMOS transistors is configured to receive a first intermediate control signal, which is a result of a logic operation on the remaining two of the first input signal, the second input signal and the third input signal, and
   wherein there are at most two stacked transistors in both the first pull-up network and the first pull-down network.

17. A full adder circuit, comprising:
   a carry out generating circuit, configured to receive a first input signal, a second input signal and a third input signal and generate a first output signal based on the first input signal, the second input signal and the third input signal; and
   a sum bit generating circuit, coupled to the carry out generating circuit, configured to receive the first output signal from the carry out generating circuit, the first input signal, the second input signal and the third input signal and generate a second output signal based on the first input signal, the second input signal, the third input signal and the first output signal,
   wherein the first output signal and the second output signal provide results of an arithmetic operation on the first input signal, the second input signal and the third input signal,
   wherein the full adder circuit is a mirror type full adder, the sum bit generating circuit comprises a first pull-up network and a first pull-down network, and the carry out generating circuit comprises a second pull-up network and a second pull-down network,
   wherein the second pull-down network comprises a NMOS transistor coupled between a ground voltage supply and an output terminal, wherein a gate of the NMOS transistor is configured to receive a second intermediate control signal, which is a result of a logic operation on the first input signal and the second input signal, and
   wherein there is at most one transistor in both the second pull-up network and the second pull-down network.

* * * * *